US009520191B2

(12) United States Patent
Moshayedi et al.

(10) Patent No.: US 9,520,191 B2
(45) Date of Patent: *Dec. 13, 2016

(54) APPARATUS, SYSTEMS, AND METHODS FOR OPERATING FLASH BACKED DRAM MODULE

(71) Applicant: HGST Technologies Santa Ana, Inc., Santa Ana, CA (US)

(72) Inventors: Mark Moshayedi, Newport Coast, CA (US); Douglas Finke, Orange, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/624,255

(22) Filed: Feb. 17, 2015

(65) Prior Publication Data

US 2015/0248935 A1 Sep. 3, 2015

Related U.S. Application Data

(63) Continuation of application No. 12/369,046, filed on Feb. 11, 2009, now Pat. No. 8,977,831.

(51) Int. Cl.
*G06F 11/07* (2006.01)
*G11C 14/00* (2006.01)
(Continued)

(52) U.S. Cl.
CPC ............. *G11C 14/0018* (2013.01); *G06F 1/30* (2013.01); *G06F 1/3296* (2013.01);
(Continued)

(58) Field of Classification Search
CPC ...... G06F 1/30; G06F 11/2015; G06F 3/0646; G06F 11/0727; G06F 11/1402; G06F 1/3225
(Continued)

(56) References Cited

U.S. PATENT DOCUMENTS 5,144,692 A 9/1992 Baker et al.
5,799,200 A * 8/1998 Brant et al. .................. 713/340
(Continued)

FOREIGN PATENT DOCUMENTS

WO WO-2006/098931 9/2006

OTHER PUBLICATIONS

International Search Report and Written Opinion for PCT Application No. PCT/US2009/33755 mailed Apr. 22, 2009. 18 pages.

*Primary Examiner* — Than Nguyen
(74) *Attorney, Agent, or Firm* — Wilmer Cutler Pickering Hale and Dorr LLP

(57) ABSTRACT

A device includes volatile memory; one or more non-volatile memory chips, each of which is for storing data moved from the volatile-memory; an interface for connecting to a backup power source arranged to temporarily power the volatile memory upon a loss of power from a primary power source; a controller in communication with the volatile memory and the non-volatile memory, wherein: the controller is programmed to move data from the volatile memory to the non-volatile memory chips upon a loss of power of the primary power source of the volatile memory; and the at least one parameter describing the volatile memory are stored in at least one of the non-volatile memory chips that store the data moved from the volatile memory. In some aspects the at least one parameter includes serial presence detect information.

20 Claims, 9 Drawing Sheets

(51) Int. Cl.
*G06F 3/06* (2006.01)
*G06F 1/30* (2006.01)
*G11C 5/14* (2006.01)
*G06F 1/32* (2006.01)
*G06F 11/14* (2006.01)

(52) U.S. Cl.
CPC .......... *G06F 3/0625* (2013.01); *G06F 3/0634* (2013.01); *G06F 3/0655* (2013.01); *G06F 3/0688* (2013.01); *G11C 5/14* (2013.01); *G11C 5/141* (2013.01); *G11C 5/143* (2013.01); *G06F 11/0727* (2013.01); *G06F 11/1402* (2013.01)

(58) Field of Classification Search
USPC .............................. 711/165, 104; 714/6.1, 14
See application file for complete search history.

(56) References Cited

U.S. PATENT DOCUMENTS

| | | |
|---|---|---|
| 7,107,480 B1 | 9/2006 | Moshayedi et al. |
| 7,269,755 B2 | 9/2007 | Moshayedi et al. |
| 7,409,590 B2 | 8/2008 | Moshayedi et al. |
| 2002/0049917 A1 | 4/2002 | Portman et al. |
| 2004/0190210 A1 | 9/2004 | Leete |
| 2005/0122791 A1 | 6/2005 | Hajeck |
| 2008/0080261 A1* | 4/2008 | Shaeffer et al. ......... 365/189.05 |
| 2008/0162790 A1 | 7/2008 | Im |
| 2008/0162867 A1 | 7/2008 | Shin et al. |
| 2009/0113144 A1 | 4/2009 | Tokunaga |
| 2009/0193179 A1 | 7/2009 | Hiroyoshi |
| 2009/0292487 A1* | 11/2009 | Duncan et al. ................. 702/63 |
| 2010/0030976 A1 | 2/2010 | Tashima et al. |
| 2010/0202240 A1 | 8/2010 | Moshayedi et al. |
| 2011/0010508 A1 | 1/2011 | Miyazaki et al. |
| 2013/0042047 A1 | 2/2013 | Nishio |

* cited by examiner

APPARATUS, SYSTEMS, AND METHODS FOR OPERATING FLASH BACKED DRAM MODULE

CROSS-REFERENCE TO RELATED APPLICATIONS

This application is a continuation application of U.S. patent application Ser. No. 12/369,046, entitled "A FLASH BACKED DRAM MODULE STORING PARAMETER INFORMATION OF THE DRAM MODULE IN THE FLASH," by Moshayedi et al., filed on Feb. 11, 2009. This application is hereby incorporated by reference herein in its entirety.

This application is related to U.S. patent application Ser. No. 12/369,027, filed Feb. 11, 2009; U.S. patent application Ser. No. 12/369,032, filed Feb. 11, 2009; U.S. patent application Ser. No. 12/369,040, filed Feb. 11, 2009; U.S. patent application Ser. No. 12/369,052, filed Feb. 11, 2009; U.S. patent application Ser. No. 12/369,076, filed Feb. 11, 2009; U.S. patent application Ser. No. 12/369,079, filed Feb. 11, 2009; and PCT Patent Application No. PCT/US09/33755, filed Feb. 11, 2009.

TECHNICAL FIELD

The disclosed subject matter relates to a flash backed dual in-line memory module (DIMM) module.

BACKGROUND

Digital processing devices, such as, for example, RAID systems sometimes use memory caches, for example, to improve performance of read and write operations. Caches are often implemented using volatile memory. However, if the power source of the volatile memory fails, the data stored in the volatile memory can be lost. In addition, a volatile memory device, such as a DRAM memory module typically requires certain parameters that describe properties of DRAM devices making up the module to be placed in a separate non-volatile memory located on the memory module. One example of this is Serial Presence Detect (SPD). However, the storing of this information can require the addition of an entire non-volatile memory to the volatile memory just for this purpose.

SUMMARY

This disclosure relates to a flash backed dual in-line memory module (DIMM) module including a non-volatile memory, a volatile memory, and a controller. During normal operation the DIMM is powered by a primary power source. When the primary power source is interrupted, a backup power source supplies sufficient temporary power to the DIMM so that the controller can transfer data from the volatile memory into the non-volatile memory before power from the backup power source is depleted. When the primary power source becomes available again, the controller transfers the data that was stored in the non-volatile memory back into volatile memory.

In one aspect, a device includes volatile memory; one or more non-volatile memory chips, each of which is for storing data moved from the volatile-memory; an interface for connecting to a backup power source arranged to temporarily power the volatile memory upon a loss of power from a primary power source; a controller in communication with the volatile memory and the non-volatile memory, wherein: the controller is programmed to move data from the volatile memory to the non-volatile memory chips upon a loss of power of the primary power source of the volatile memory; and parameters describing the volatile memory are stored in at least one of the non-volatile memory chips that store the data moved from the volatile memory. In some aspects, the parameters include serial presence detect information.

In another aspect, a method includes moving data from a volatile memory to non-volatile memory chips, each of which is for storing data moved from the volatile-memory, upon a loss of power of a primary power source of the volatile memory based on parameters describing the volatile memory stored in at least one of the non-volatile memory chips that store the data moved from the volatile memory while the volatile memory is temporarily powered by a backup power source. In some aspects, the parameters include serial presence detect information.

DETAILED DESCRIPTION

Figure 1:
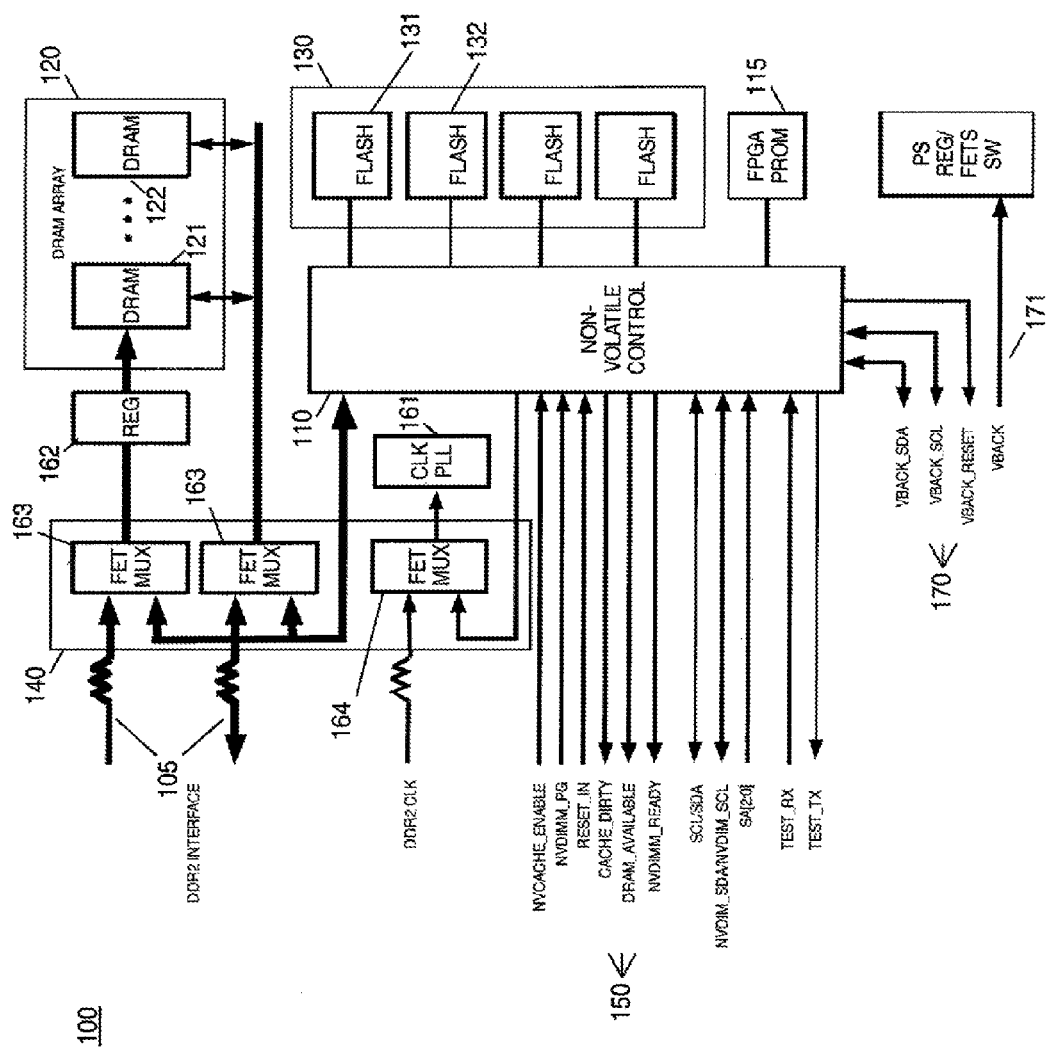
FIG. 1 is a block diagram of a dual in-line memory module (DIMM).

Referring to FIG. 1, the described embodiment of the invention is a dual in-line memory module (DIMM) 100 that includes volatile memory 120, non-volatile memory 130, isolation logic 140, and a controller 110. DIMM 100 is connected to a primary power source (not show) to support normal operation and is also connected to a backup power source 200 (see FIG. 2). When DIMM 100 is operating under power supplied by the primary power source, an external system (e.g. a RAID system) stores data in and reads data from volatile memory 120 through interface 105. However, when the power from the primary power source 200 is interrupted, a backup power source supplies sufficient temporary power to DIMM 100 so that controller 110 can cause isolation logic 140 to isolate volatile memory 120 from the external system and then transfer data from volatile memory 120 into non-volatile memory 130 before power from backup power source 200 is depleted. When the primary power source becomes available again, controller 110 transfers the data that was stored in non-volatile memory 130 back into volatile memory 120 and causes isolation logic 140 to reconnect volatile memory 120 to the external system.

Volatile memory 120 is a DRAM array that includes various DRAM chips, e.g., DRAM chips 121 and 122. Non-volatile memory 130 includes various flash memory devices, e.g., flash devices 131 and 132. Due to constraints of DIMM 100, all the data stored in volatile memory 120 cannot be moved to non-volatile memory 130 at one time. One of these constraints is that the flash devices of non-volatile memory 130 cannot be written into as fast as the DRAM devices of volatile memory 120 can be read from. To account for this discrepancy, data is moved from volatile memory 120 to non-volatile memory 130 one DRAM chip at a time. In addition, during the transfer of data from volatile memory 120 to non-volatile memory 130, DRAM chips not being actively transferred are put into a low power state that maintains the data stored in them but consumes less power than a normal operating state. In the DRAM chips of volatile memory 120, this low power state is self-refresh mode. By putting the DRAM chips that are not being actively transferred into a low power state, module 100 requires less power during the backup operation than it would otherwise. This allows, for example, for a smaller and less expensive backup power source to be used.

Figure 2:
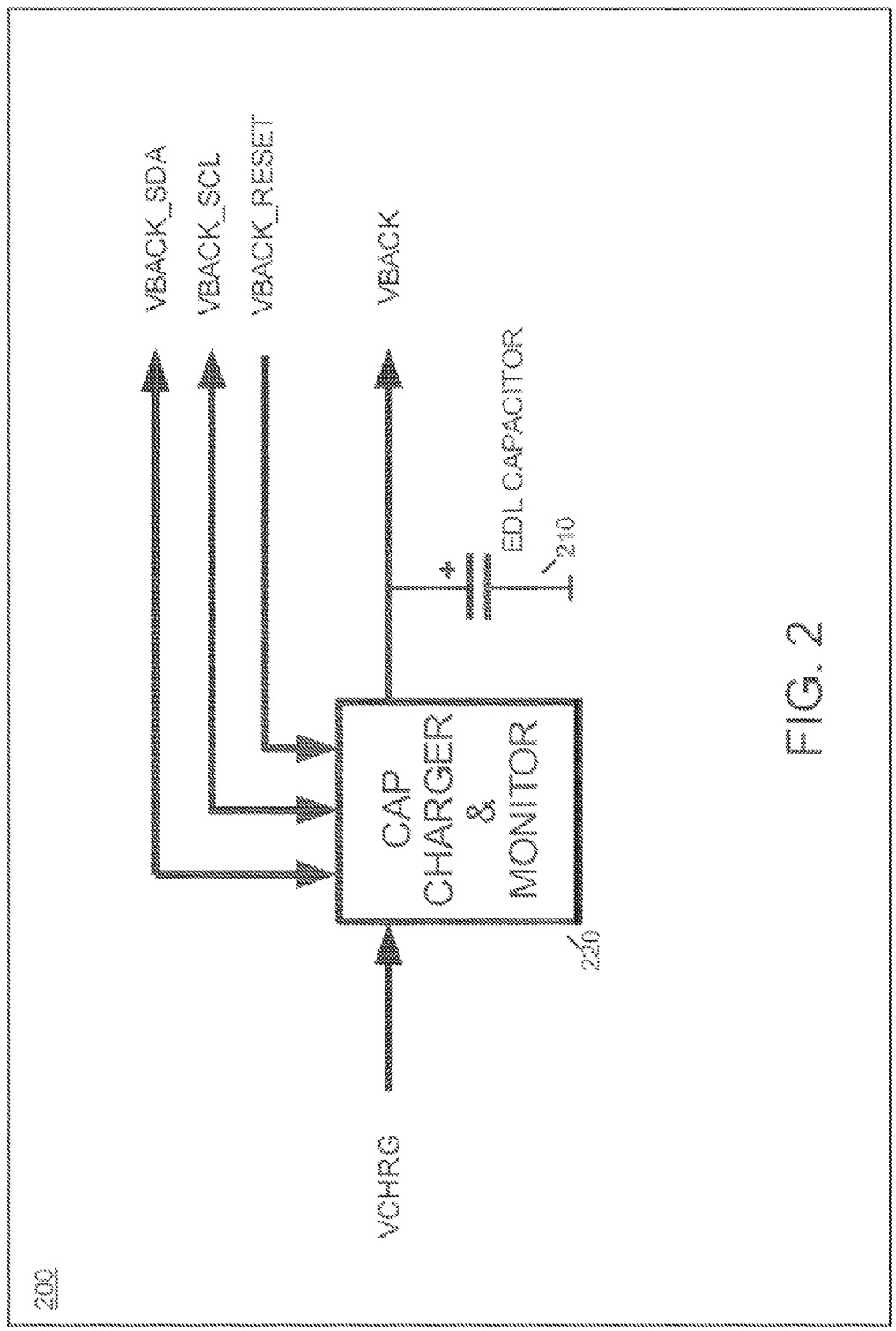
FIG. 2 is a block diagram of a capacitor based backup power supply that can be used to power components of FIG. 1 in the event of a power failure.
Figure 3:
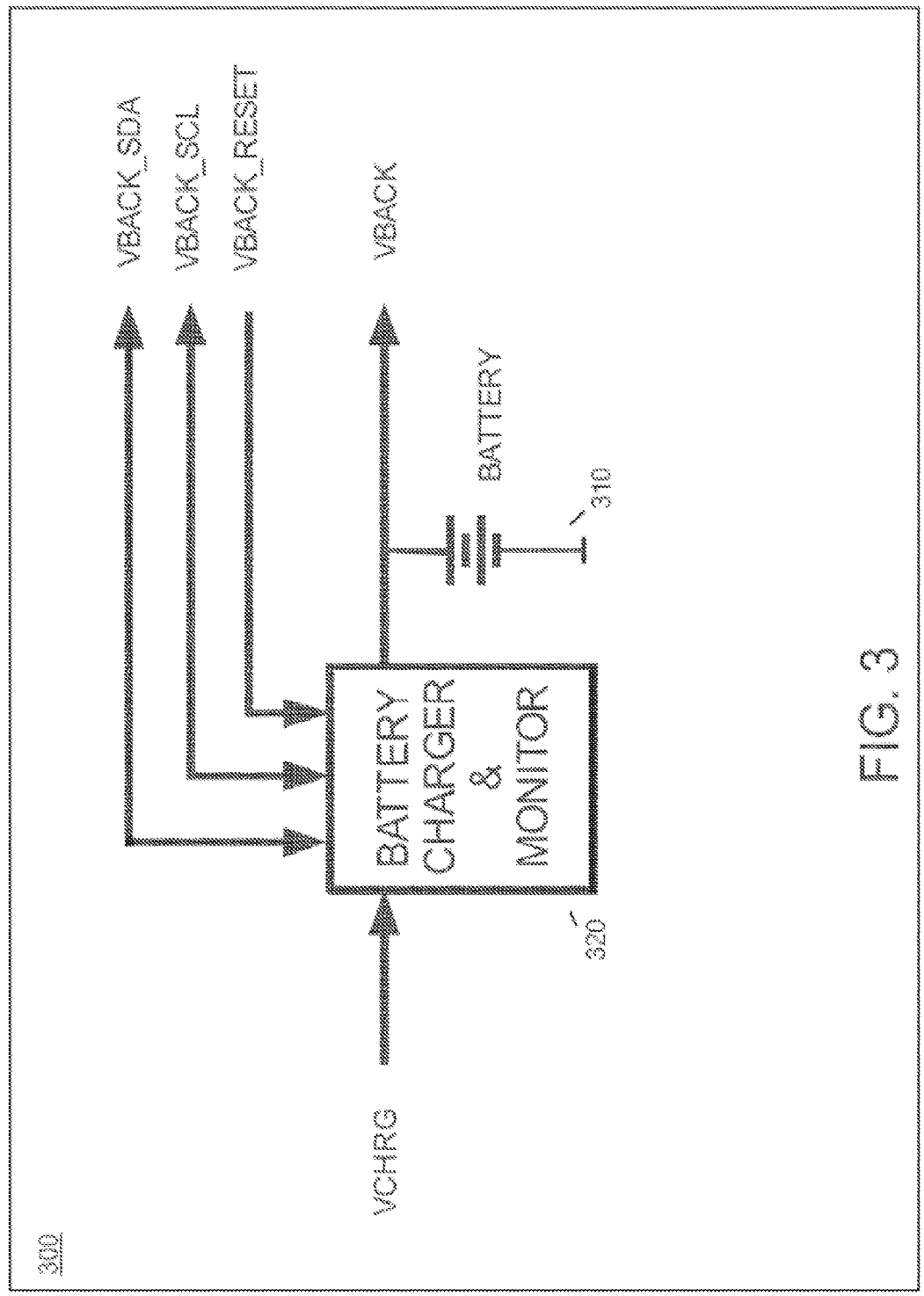
FIG. 3 is block diagram of a battery based backup power supply that can be used to power components of FIG. 1 in the event of a power failure.

FIG. 2 shows a block diagram of such a power source. Specifically, FIG. 2 shows a electrochemical double layer (EDL) capacitor backup supply module 200 that interacts with DIMM 100 using interface lines (e.g., power, I/O, etc.) 170 (EDL capacitors are also known as super capacitors and ultra capacitors). Capacitor 210 supplies the backup power to DIMM 100 upon a power failure of the primary power source of DIMM 100. Charger and monitor 220 charge capacitor 210 and perform state-of-health monitoring of capacitor 210 so that, for example, DIMM 100 can be alerted if capacitor 210 is failing and can no longer provide backup power. In some cases, a battery may be selected instead of a capacitor. For example, FIG. 3 shows a block diagram of a battery backup power supply module 300 that can be used instead of module 200.

Non-volatile memory 130 is embedded with the serial presence detect (SPD) information for volatile memory 120 (e.g., information that describes the size and speed of DRAM chips in volatile memory 120). By using non-volatile memory 130 to store the SPD information of volatile memory 120, volatile memory 120 avoids the need for having a separate EEPROM module for storing this information. Avoiding the addition of a separate EEPROM saves costs, reduces the size module 100, and reduces the number of components required.

DIMM 100 includes two I2C buses between the external system and controller 110. I2C busses are typically used to attach low-speed peripherals to various devices when, for example, simplicity and low manufacturing cost are more important than speed. The first I2C bus is for accessing the Serial Presence Detect (SPD) EEPROM (the "SPD I2C bus"). This is defined by the standard JEDEC spec. The second I2C bus is used to access other module 100 information, such as, status information and state-of-health (SoH) information for controller 110, non-volatile memory 130, and backup power source 200 (the "NVDIMM I2C bus"). The status information can include, for example, current state of the flash memory (written, erased, erasing, defective, etc.); number of bad blocks swapped out; number of spare blocks remaining; total number of download cycles completed; number of ECC errors in last download; number of ECC errors in last restore; status of last download (in progress, completed no errors, completed with errors, etc.); status of last restore (in progress, completed no errors, completed with errors, etc.); flash header information. The SoH information can include, for example, current state of the backup power source (charged, discharged, charging, etc.), whether any capacitors making up a backup power source have failed (and if so, which capacitors have failed), and type of backup power source (e.g., capacitor or battery).

Block Diagram Details

Flash memory 130 provides the nonvolatile storage on the DIMM and is implemented using Secure Digital (SD)/MultiMediaCard+ (MMC+). Controller 110 can support various arrangements, for example, four independent SD/MMC+ interfaces to four SD mass storage devices each operating with 20 Mbyte/sec bandwidth using a 4-bit data bus or four MMC+ mass storage devices each operation with 40 Mbyte/sec bandwidth using an 8-bit data bus. One advantage of using SD/MMC technology is the complexity of managing flash memory is hidden from controller 110 using a simple, low pin count interface. The flash memories can be implemented in a single device, for example, the SanDisk iNAND, or can be constructed using a discrete SD controller with separate NAND memory devices on the same DIMM. In either case, the SD/MMC controller is responsible for ECC and bad block management according to the NAND technology used.

Serial Presence Detect (SPD) data is stored in the first 256 bytes of the flash memory attached to the first SD/MMC+ interface (i.e., flash chip 131). The typical write protection mechanism is implemented using flags stored within the flash configuration space. Controller 110 implements a read-cache, write-through mechanism for the SPD data, where the SPD information can be stored in a cache on controller 110 (in addition to on a flash chip 131). During system power up, controller 110 fetches the SPD data from the flash memory. Read operations on the SPD I2C interface use the cached data while write operations are immediately written to the flash memory. During the write operation to the flash memory, the SPD I2C interface will ignore any read or write requests.

The status information data is stored in the second 256 bytes of the flash memory attached to the first SD/MMC+ interface. This interface allows the user to monitor and configure the operation of the non-volatile functions. The region is also used to track the system state during the last power cycle. Controller 110 implements a read-cache, write-cache mechanism for the configuration data, where the status information can be stored in a cache on controller 110 (in addition to on a flash chip 131). During system power up, the FPGA fetches the data from the flash memory. Read and write operations on the NVDIMM I2C interface use the cache data. Cache data is written back during power-off and power-loss (backup) events.

Controller 110 is an advanced embedded processor with a custom 133 MHz DDR controller, four custom SD/MMC+ host interfaces, the SPD I2C interface, and the NVDIMM I2C interface. The microprocessor can be, for example, a soft 32-bit Altera NIOS RISC processor executing firmware from the internal memory instance in the FPGA (programmable read-only memory (PROM) 115). The processor controls the operating state of module 100 data movement between the DDR and SD/MMC+ interfaces and communication on the SPD and NVDIMM I2C interfaces. The custom DDR interface allows controller 110 to manipulate the DRAM array on a per byte-lane basis. The interface has individual control of the CKE signals allowing each device in the DRAM array to be controlled. The controller uses the first 8 bytes in each byte lane in the array to set the internal phase alignment of the bus. The four custom SD/MMC+ interfaces are designed for embedded applications where features such as hot plug are not required. The interface supports 1-bit, 4-bit and 8-bit operation at clock speeds up to 50 MHz. The interfaces also can operate together synchronizing four SD/MMC+ cards allowing high-bandwidth read and write operations without large amounts of data buffering. For applications requiring the SD/MMC+ cards to be removed, the FPGA host interface allows the cards to be reordered for situations where the cards are not installed in the correct order.

Volatile Memory 120 is a DRAM array. Various examples configurations including 8 bits of error correcting code (ECC) for every 64 bits of actual data are shown in the table below. In the example with two Giga bytes of NVDIMM, one rank can be turned on and off depending on current memory requirements. Turning off a rank when it is unneeded saves power. When data (actual data and ECC) is moved from volatile memory 120 to non-volatile memory 130, non-volatile memory 130 stores the actual data and ECC without a distinction between the two stored in the non-volatile memory 130. When the data is moved back from non-volatile memory 130 to volatile memory 120, controller 110 restores the actual data and ECC back into volatile memory 120 as is appropriate for the particular DRAM devices being used.

| NVDIMM Total | DRAM Device | Configuration | # of DRAMs | Ranks |
|---|---|---|---|---|
| 256 Mbyte | 512 Mbit | 32 Mwords × 16 bits | 5 | 1 |
| 512 Mbyte | 1 Gbit | 64 Mwords × 16 bits | 5 | 1 |
| 1 Gbyte | 1 Gbit | 128 Mwords × 8 bits | 9 | 1 |
| 2 Gbyte | 1 Gbit | 128 Mwords × 8 bits | 18 | 2 |

PLL 161 is a high performance, low skew, PLL-based, zero-delay buffer that distributes a differential input clock signal to the DRAM array. The DDR clock from the edge connector is multiplexed with the DDR2 clock from controller 110 to prevent PLL 161 from entering into its low power state and tristating its outputs. In this example design, the selected PLL must operate at the desired system rate as well as a slower DDR controller rate. In general, PLLs bypass themselves and operate as a small-delay buffer at the slowest clock rates Control and address signals are re-driven through registers 162 to the DRAM devices on the following rising clock edge (data access is delayed by one clock). Controller 110 uses tri-states to access the address and control signals. When controller 110 controls DRAM 120, the register is isolated from the edge connector using FET bus switches 163 and controller 110 can directly drive the register inputs. When the system controls the DRAM array, the FET bus switches 163 are on and the FPGA tri-states its outputs. The CKE signals are treated differently from the other control signals. The switching between the two operational modes is glitchless to ensure DRAM 120 remains in self-refresh mode. For these signals, FET switches 163 are used to multiplex between the edge connector (leading to the system) and controller 110.

The high-bandwidth FET multiplexers 163 and 164 are designed to support high-bandwidth applications such as memory interleaving, bus isolation and low-distortion signal gating. The FET multiplexers 163 and 164 isolate module 100 from the system bus during a power-loss event. The FET multiplexers use a charge pump to elevate the gate voltage of the pass transistor, to provide a low and flat on-state resistance. The low and flat on-state resistance allows for minimal propagation delay and supports rail-to-rail switching on the data input/output (I/O) ports. The FET multiplexers also feature low data I/O capacitance to minimize capacitive loading and signal distortion on the data bus.

Depending on the configuration of module 100, not all data stored in volatile memory 120 is backed up to non-volatile memory 130. Instead, module 100 can be configured to backup (and later restore) data stored in select portions of volatile memory 120. Information stored in non-volatile memory is typically key/directory information used to determine the location of information (e.g., files) in a file system. Key/directory information is critical information that essentially all users will choose to backup. However, other types of information can also be stored in volatile memory 120. For example, software program information that does not change (e.g., a ".exe" file) can be stored in volatile memory 120. Controller 110 includes registers that allow a user to segment volatile memory 120. A starting address is stored in one register and an ending address is stored in a second register. All data stored between these two addresses will be backuped and restored. Data stored outside of these addresses will not be backed-up/restored. The values of these registers are controlled through the NVDIMM I2C bus. Users, may choose for example, specify the starting and ending addresses such that only key/directory information is backed-up/restored. One reason for choosing to only restore key/directory information is to improve restore time by not wasting time restoring information that does not need to be restored from non-volatile memory 130 (e.g., a ".exe" has very likely not changed and can be loaded from the host system when required).

Module 100 can be configured to support various numbers of flash chips (e.g., 1-4) and is its firmware is programmed depending on the selected number. The number of flash chips used can be based on, for example, the size of volatile memory that needs to be backed up and the time in which the backup must occur (e.g., the amount of time backup power can be supplied) or on reaching a desired restore speed (e.g., more flash devices allow for a quicker restore time). For example, for a controller that can support up to four flash chips, the controller would have four busses. Each of the busses can be connected (or not connected) to a flash chip depending on the selected number of flash chips. The selected number of flash chips (e.g., 1, 2, or 4) are connected to the busses and soldered onto a printed circuit board (PCB). For a module 100 that is designed to accommodate up to four flash chips, if only two flash chips were installed, the remaining space for the not-installed two flash chips remains empty and controller 110 is programmed to only attempt to communicate with the two installed flash chips. For a constant backup time or restore time, the number of flash chips can be increased in proportion with the size of the volatile memory. Alternatively, the backup time and restore time can be reduced by increasing the number of flash chips.

Signal Descriptions

Module 100 implements a 72 bit DDR2 memory interface with a 244 pin mini-DIMM connector. The connector signal assignments are defined in JEDEC Standard 21C Page 4.20.14-2, DDR2 Registered Mini-DIMM Design Specification (currently available from www.jdec.org). Signals corresponding to each of the 244 pins are not illustrated in FIG. 1 to avoid making FIG. 1 unreadable.

The NVDIMM_RESET signal initializes controller 110 and forces the controller to restart its state machine. Controller 110 is also reset when the standard RESET_IN input is asserted (along with, for example, volatile memory 120 and register 162). When the controller 110 is held in reset by NVDIMM_RESET, module 100 operates normally. That is, the when NVDIMM_RESET is asserted, FET switches 163 are held on thus allowing the system to access the DRAM memory 120 without further interaction.

The NVDIMM_PG signal reports the state of the power in the user system. When the signal is high, the system power rails are operating within specification. When the signal goes low, power loss is imminent and controller 110 moves data to flash memory 130. The system puts all DRAM devices (e.g., 121-122) into self-refresh operation before deasserting NVDIMM_PG if the DRAM device data is to be moved to flash memory (as indicated by the NVCACHE_ENABLE signal). If NVCACHE_ENABLE is low when NVDIMM_PG deasserts, then the data in the DRAM devices is ignored during the power loss event.

The NVCACHE_ENABLE signal reports the existence of cache data in the DRAM devices that should be moved to flash memory if the system power fails. If NVCACHE_ENABLE is high when NVDIMM_PG deasserts, controller 110 moves the data in the DRAM devices to flash memory. If NVCACHE_ENABLE is low when NVDIMM_PG deasserts, the DRAM contents are ignored and are not stored in flash memory 130. That last sequence used by the system to shut down normally (e.g., without a power failure in response to a user requesting a shut-down). When NVDIMM_PG is low, NVCACHE_ENABLE is ignored by controller 110 to prevent spurious transitions on the signal from affecting any backup events.

During restore operations, the NVCACHE_ENABLE is used by the system to signal to controller 110 that flash memory 130 may be erased. A dirty tag within the flash memory is not cleared until a handshake with NVCACHE_ENABLE is completed. This allows, for example, the system to handle another power loss event during the restore operation.

After the data is moved from flash memory 130 to DRAM 120, the DRAM_AVAILABLE signal is asserted indicating the system may access the data. When the system decides flash memory 130 should be purged (e.g., to prevent data to be restored again after a power loss event), the system deasserts (falling edge) NVCACHE_ENABLE to reset the flash memory. The system waits for NVDIMM_READY to assert before asserting NVCACHE_ENABLE again. The system can continue to use module 100 before NVDIMM_READY asserts, but the data will not be backed up during a power-loss event.

The CACHE_DIRTY signal indicates that flash memory 130 contains a data image of DRAM 120. During the BACKUP state, the CACHE_DIRTY signal indicates the start of the backup process. During POWER UP state, the CACHE_DIRTY indicates that flash memory 130 contains a backup image. The signal is held high until the NVCACHE_ENABLE signal is deasserted (falling edge), indicating the cache data has been read from DRAM 120.

The DRAM_AVAILABLE signal indicates when the system can access DRAM 120. When DRAM_AVAILABLE is low, controller 110 has control of DRAM 120. When the signal is high, the system can take the DRAM devices (e.g., 121-122) out of self-refresh and access the data. In the event of a power up with data in flash memory 130, DRAM_AVAILABLE will remain deasserted until the flash data is moved to DRAM 120. Once the signal asserts, the system may read and write to DRAM 120, but cannot assert NVCACHE_ENABLE until module 100 is ready. A delay between the assertion of DRAM_AVAILABLE and NVCACHE_ENABLE may arise, for example, after a restore operation because non-volatile memory 130 is being erased or the backup power source is being recharged. The system may choose to only read from (as opposed to reading from and writing to) volatile memory 120 during this time.

The NVDIMM_READY signal indicates that module 100 is capable of handling a power-loss event. The signal does not assert until the external power source is in good health and fully charged. When configured to fully erase flash memory 130, the NVDIMM_READY signal will also not assert until flash memory 130 is fully initialized to a known state. This feature allows the design to support flash memory devices that cannot support full-speed burst write operations without erasing the flash memory. During normal system operation (idle state), the system cannot assert NVCACHE_ENABLE until NVDIMM_READY is asserted. During backup operation, NVDIMM_READY is deasserted. During restore operation, NDIMM_READY is deasserted. If controller 110 determines at any time that a power loss event cannot be handled correctly, for example, if the EDL capacitor bank failed a self-test operation, controller 110 deasserts the NVDIMM_READY to notify the system to move any cache data from the DIMM memory (e.g., to move the data to permanent storage such as a hard drive of the system).

The NVDIMM_SEATED is a pull-up pin on the DIMM pin out that allows the system to detect module 100. The system also can also detect module 100 by attempting to read from the NVDIMM I2C interface to see if the I2C slave responds.

The NVDIMM I2C slave interface on controller 110 provides a full-feature user interface to controller 110. A user can configure and control controller 110 as well as access detailed status information using the NVDIMM_SDA and NVDIMM_SCL (signals 152).

V3P3_AUX is the auxiliary 3.3V voltage rail that supplies power to the nonvolatile logic during normal system operation. During a power loss condition, module 100 switches from this supply and operates from VBACK 171 (the voltage rail that is the power supply used during the backup operation) until controller 110 turns itself off.

Module 100 also includes a third I2C interface that is located between controller 110 and backup power source 200 (the "backup power supply I2C interface"). The backup power supply I2C interface allows controller 110 to communicate with the external backup power supply module using VBACK_SDA and VABACK_SCL. Through the interface, controller 110 can determine the type of backup power method (e.g., EDL capacitor or battery) as well as determine the state-of-charge and state-of-health for the power supply. Information communicated across the backup power supply I2C interface can be communicated across the NVDIMM I2C interface as part of the SoH information. The backup power supply reset (VBACK_RESET) allows controller 110 to reset the external backup power supply module. The VCHRG voltage rail supplies power to the EDL capacitor charge or external battery backup power supply module. The voltage rail is nominal 12 volts capable of sourcing 500 mA.

Signals TEST_RX and TEST_TX make up a production test interface that is a 57.6 Kbaud serial link. During normal system operation, the test signals are tri-stated and floating.

States and State Transitions

Figure 4:
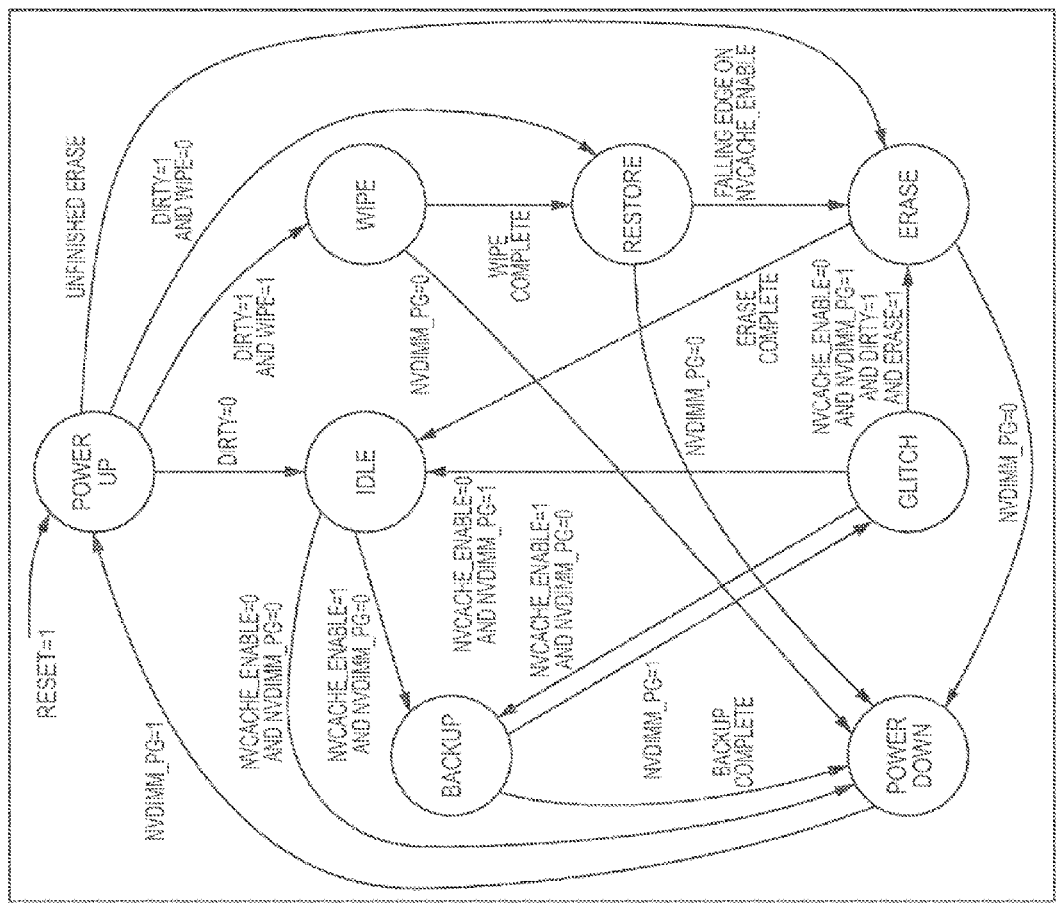
FIG. 4 is a block diagram illustrating example states and transitions of the DIMM illustrated in FIG. 1.

FIG. 4 illustrates a state diagram that shows various states and state transitions of module 100. For example, module 100 is initialized to the POWER UP state by the system reset no matter what state the module is operating in. In this case, the module initializes all logic and fetches configuration from the flash memory before determining what happened on the last power cycle. For example, the module loads firmware from FPGA PROM 115; CACHE_DIRTY is asserted, and NVDIMM_READY and DRAM_AVAILABLE are deasserted. The SD/MMC+ flash memories are initialized to the SD/MMC+ transfer state. The flash configuration block is read to determine the state of the last power cycle. If the DIRTY tag is set and the previous backup operation completed successfully, the state transitions to the WIPE state (if configured to wipe run-time area). If not configured to wipe run-time area, the state transitions to the RESTORE state. If the DIRTY tag is set and the backup operation did not complete successfully, the state moves to the ERASE state (if the ERASE bit is set) or to the IDLE state with DRAM_AVAILABLE and CACHE_DIRTY set. If the previous ERASE state did not finish cleanly and the ERASE bit is set, then transition to the ERASE state to redo the erase cycle. If the DIRTY tag is not set, then CACHE_DIRTY is deasserted, DRAM_AVAILABLE is asserted, and the state transitions to the IDLE state.

The IDLE state is the normal operating state when the system power is applied. If CACHE_DIRTY is already set and NVCACHE_ENABLE is then asserted, CACHE_DIRTY is deasserted. CACHE_DIRTY can be used to confirm the response of an unsuccessful restore operation due to an invalid backup. If NVCACHE_ENABLE is asserted and NVDIMM_READY is asserted, asserting CACHE_DIRTY acknowledges that the controller is now operating in a nonvolatile state (power loss will trigger a backup operation). If NVCACHE_ENABLE deasserts, deassert CACHE_DIRTY to acknowledge that the controller is now operating in volatile state (power loss will not a backup operation). If the backup power source is within voltage specification, asserting NVDIMM_READY indicates the system can support a power failure. If the backup power source fails self-test (or for any other reason controller 110 cannot complete the backup operation), deasserting NVDIMM_READY signals the system to empty the cache. If CACHE_DIRTY is asserted and NVDIMM_PG deasserts, power has been lost and DRAM memories contain data to be written to the flash memories. In such a case, controller 110 deasserts DRAM_AVAILABLE and NVDIMM_READY and transitions to the BACKUP state. If CACHE_DIRTY is deasserted and NVDIMM_PG deasserts, the DRAM memories do not contain valid data and the power is turning off normally. In such a case, deassert DRAM_AVAILABLE and NVDIMM_READY (if set) and transition to the POWER DOWN state.

The BACKUP state is responsible for moving data from the DRAM 120 to the flash memory 130, while operating on backup power. If the GLITCH bit is not set, controller 110 waits for CKE to go low to ensure the DRAM memories are placed in self-refresh (the GLITCH bit is set if a backup operation started, but during the operation the power came back up). The on-board regulators switch to source power from the backup power. The DDR bus is disconnected and controller 110 drives DRAM 120. Controller 110 masks off the NVCACHE_ENABLE signal as the system may be powered off. Controller 110 asserts the DIRTY register and writes the flash configuration page to record the start of the backup process. If a checkpoint exists due to transitioning back from the GLITCH state, controller 110 restarts the backup from the checkpoint. Otherwise, for each DRAM device of DRAM 120, take the DRAM device out of self-refresh and write the contents the flash memory 130. If NDIMM_PG asserts during the memory copy operation, put the active DRAM device back into self-refresh, checkpoint the current backup point and move to the GLITCH state. When all DRAM devices have been copied to flash and the flash has completed its programming cycle, controller 110 writes the flash configuration with current state information and waits for the programming cycle to complete. Finally, controller 110 moves module 110 to the POWER DOWN state.

The POWER DOWN state handles the power down operation to prevent memory module 100 from restarting prematurely if system power is still available. That is, NVDIMM_PG may indicate a power-loss event, but system power may not have been removed from the memory module. Controller 110 switches on-board regulators back to normal power if operating on backup power. Controller 110 tri-states the interface between the controller and the multiplexers 163 and connect the DRAM devices to the DDR bus. If NVDIMM_PG ever asserts, system power is still present so the system is restarted by moving to the POWER UP state.

The glitch state signifies a case in which the system temporarily lost power, but power has returned before the backup operation completed thus allowing the user to retrieve the DRAM contents without using the flash data. The GLITCH state may be entered multiple times during a backup operation. There are two outcomes when in the GLITCH state. Either the power-loss event continues and the data within the DRAM 120 is backed up to flash 130 or the data within DRAM 120 is retrieved and NVCACHE_ENABLE is deasserted. If the power loss is temporary, the memory module must still recharge the EDL capacitor to a known state before asserting NVDIMM_READY and allow the system to rely on the nonvolatile function. To do so, module 100 records the event by asserting the GLITCH register indicating the power restored before loss of backup power; switches the on-board regulators to source power from the normal system power; tri-states controller 110 and reconnect the DDR bus to the DRAM memories; asserts DRAM_AVAILABLE indicating data is available; unmasks the NVCACHE_ENABLE signal because the system can empty the DRAM devices of data; if NVDIMM_PG is asserted and NVCACHE_ENABLE is deasserted, the partial copy in the flash memories is not required, deasserts CACHE_DIRTY and transitions to the ERASE state; if NVCACHE_ENABLE is asserted and NVDIMM_PG deasserts, power has been lost and DRAM memories contain data to be written to the flash memories, deasserts DRAM_AVAILABLE and transitions to the BACKUP state to resume from the checkpoint.

The wipe state, is for applications where part of the DRAM 120 is used for run-time, non-volatile purposes (e.g., if a user has decided to store non-key/directory information in volatile memory 120 and has chosen not to backup/restore the non-key/directory information) In the wipe state controller 110 can be configured to zero out a single continuous region in the address space. This feature prevents spurious ECC errors within the DRAM memories. Module 100: disconnects the DDR bus and has controller 110 drive the DRAM memories; if the wipe function is interrupted by loss of power indicated by NVDIMM_PG deasserting, transitions to the POWER DOWN state; for each DRAM, initializes the configured address space to zero and initializes the associated ECC values; when all DRAMs are completed, transitions to the RESTORE state.

The RESTORE state transfers flash memory 130 contents back to DRAM 120. The state is not exited until the system indicates the restored data in the DRAMs has been read, in order to handle power-loss events during this state. A power-loss event during the RESTORE state causes the same image to be restored to the DRAM memory on the next power-on event. Module 100: If not already done so, disconnects the DDR bus and has controller 110 drive the DRAM memories; records in the flash configuration memory that the restore operation has started allowing the system to detect a multiple restore event; for each DRAM, copies the contents from the flash memory to the DRAM; when all DRAMs are completed, updates the MODE bytes with the value stored in the flash configuration (system MODE value as the MODE value is read only) and puts that DRAM into self-refresh operation; if the restore function is interrupted by loss of power indicated by NVDIMM_PG deasserting, transitions to the POWER DOWN state; tri-states controller 110 and reconnects the DDR bus to DRAM 120; asserts DRAM_AVAILABLE; and when NVCACHE_ENABLE transitions from high to low (falling edge), transitions to the ERASE state to erase the flash contents.

Some flash memory devices require the memory to be erased in order to achieve maximum bandwidth performance during large sequential write operations. In such embodiments, the system at least clears any flags indicating that a partial copy or image exists in the flash memory. The erase operation cannot occur until the system has indicated that any data in DRAM 120 (that is, the restored data or partially backup data) has be read from DRAM 120. Module 100 enters the ERASE state and: if an erase cycle was interrupted by another power loss, restarts the erase cycle at the beginning; tri-state controller 110 and reconnect the DDR bus to the DRAM 120; assert DRAM_AVAILABLE; if required, writes the flash configuration to clear any flags indicating a potential backup or a backup image within the flash memory and to mark that an erase cycle has started; if the ERASE register is asserted, erases the flash memory modules; if the erase function is interrupted by loss of power indicated by NVDIMM_PG deasserting, transitions to the POWER DOWN state; updates the flash configuration when the erase cycle completes normally; when erase operation is completed, transitions to IDLE state.

I2C Interfaces

The FPGA controller has two separate slave I2C interfaces that are controlled using the same protocol as the industry standard two-wire I2C serial EEPROM (i.e., the SPD I2C interface and the NVDIMM I2C interface). The base address for the SPD I2C interface is set at the standard 0xA0 while the base address for the NVDIMM I2C interface is set at 0xB0. The 1-bit address offset is applied to both base addresses to allow the two interfaces to connected together if required and inter-operate with other modules. That is, SPD I2C interface and the NVDIMM I2C interface can be implemented as a single physical interface that use different address ranges. Controller 110 uses the first 512 byte block in the flash memory attached to the first SD/MMC+ interface. The first half of the block is used for SPD data while the second half of the block is used for flash configuration.

Figure 5:
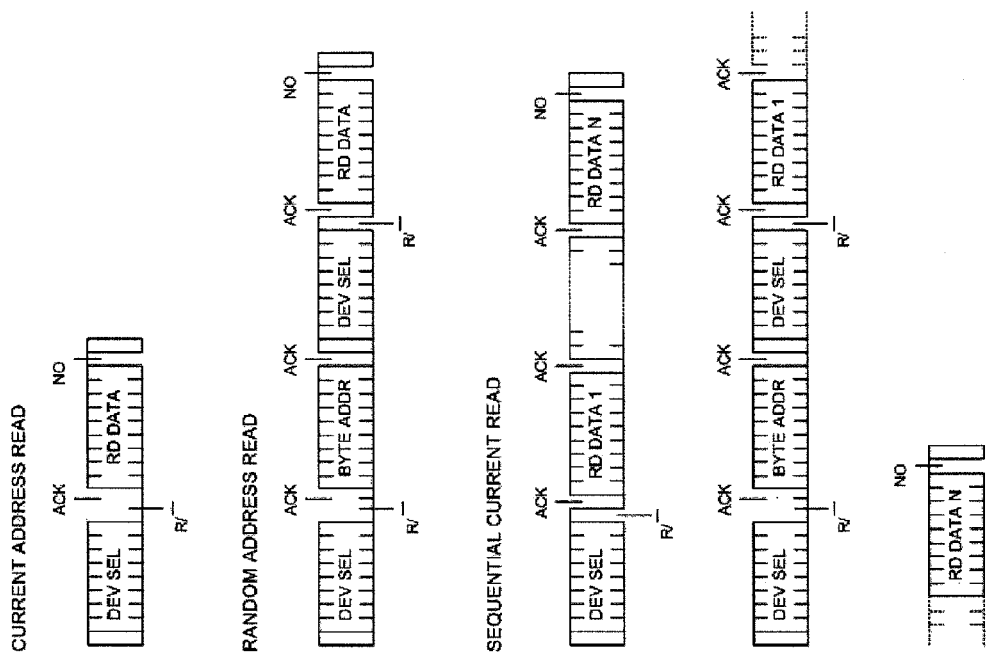
FIG. 5 shows various read operation timing diagrams of an Inter-Integrated Circuit (I2C) interface of the DIMM illustrated in FIG. 1.
Figure 6:
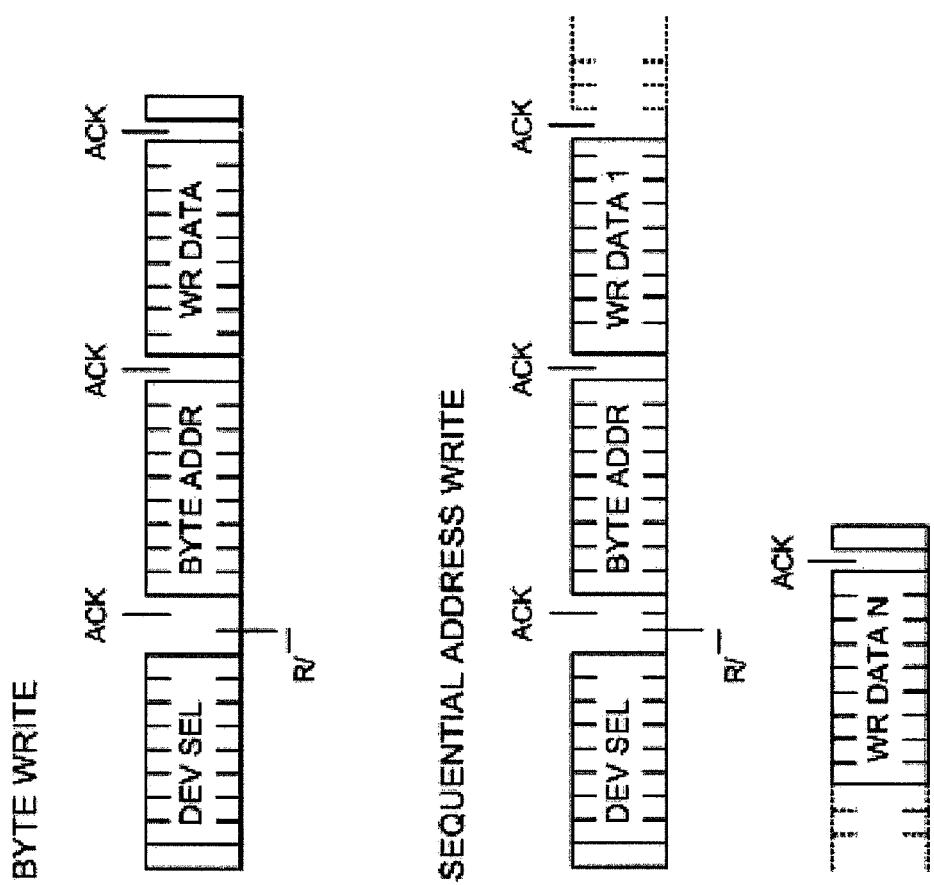
FIG. 6 shows various write operation timing diagrams of an Inter-Integrated Circuit (I2C) interface of the DIMM illustrated in FIG. 1.

FIG. 5 shows the functional operation of a read using the I2C interfaces. FIG. 6 shows the functional operation of a write using the I2C interfaces.

Debug, Maintenance, Test, and Scan

Module 100 also includes functionality for debugging, maintenance, testing, and scanning. For example, if controller is implemented using an Altera processor, the Altera JTAG UART interface is a fully featured debug and monitoring interface that allows the user to access the firmware functions. Using the Altera tool suite, the firmware can be monitored and/or overwritten with new firmware for investigation purposes. Using the built-in UART function, the JTAG interface can be used to emulate a serial interface allowing slow-speed custom communication. As well, for larger FPGA configurations, the firmware can incorporate a test user interface to perform diagnostic tests on the DRAM and flash memories for testing purposes. The test user interface is also accessed through UART built into the Altera JTAG interface.

During production test, controller 110 can be held in reset to allow DRAM 120 and SD/MMC+ flash 130 to be tested. Thus, FET switches 163 and 164 on the DDR interface are held in the proper state when controller 110 is held in reset. At the same time, controller 110 tri-states the SD/MMC+ interfaces to allow for bed-of-nail testing of the flash memories.

Controller 110 has a production test control that configures the firmware to run a production test on the DDR interface and SD/MMC+ interfaces to ensure proper connectivity. Controller 110 reads and writes to the DDR memory devices to exercise the address, data and control signals of the DDR. As well, controller 110 passes sufficient data over the SD/MMC+ command and data buses to exercise all signals. As an end-customer production test, the NVDIMM I2C interface provides a mechanism to control the backup and restore operations and directly access the flash and DDR memory.

FPGA Architecture

Figure 7:
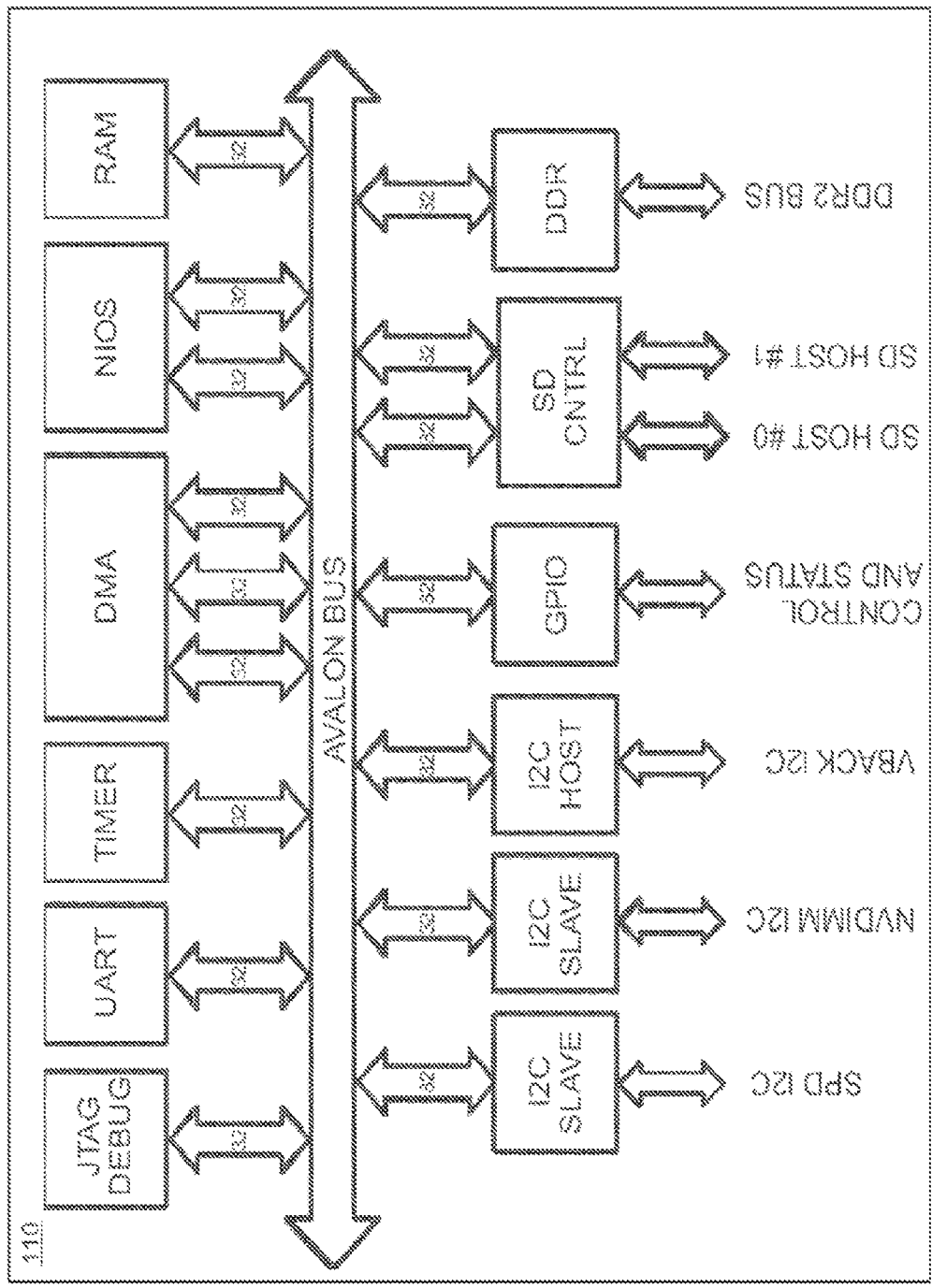
FIG. 7 shows the architecture of the DIMM illustrated in FIG. 1.

FIG. 7 shows an example architecture of controller 110 that uses the embedded NIOS processor with the Avalon bus to connect the IP blocks together (For example, if controller is implemented using an Altera processor, the Altera JTAG). Changes to a design from Altera include another I2C interface (the NVDIMM I2C interface), updated GPIO and modified firmware for the new features.

Power Supply Description

Figure 8:
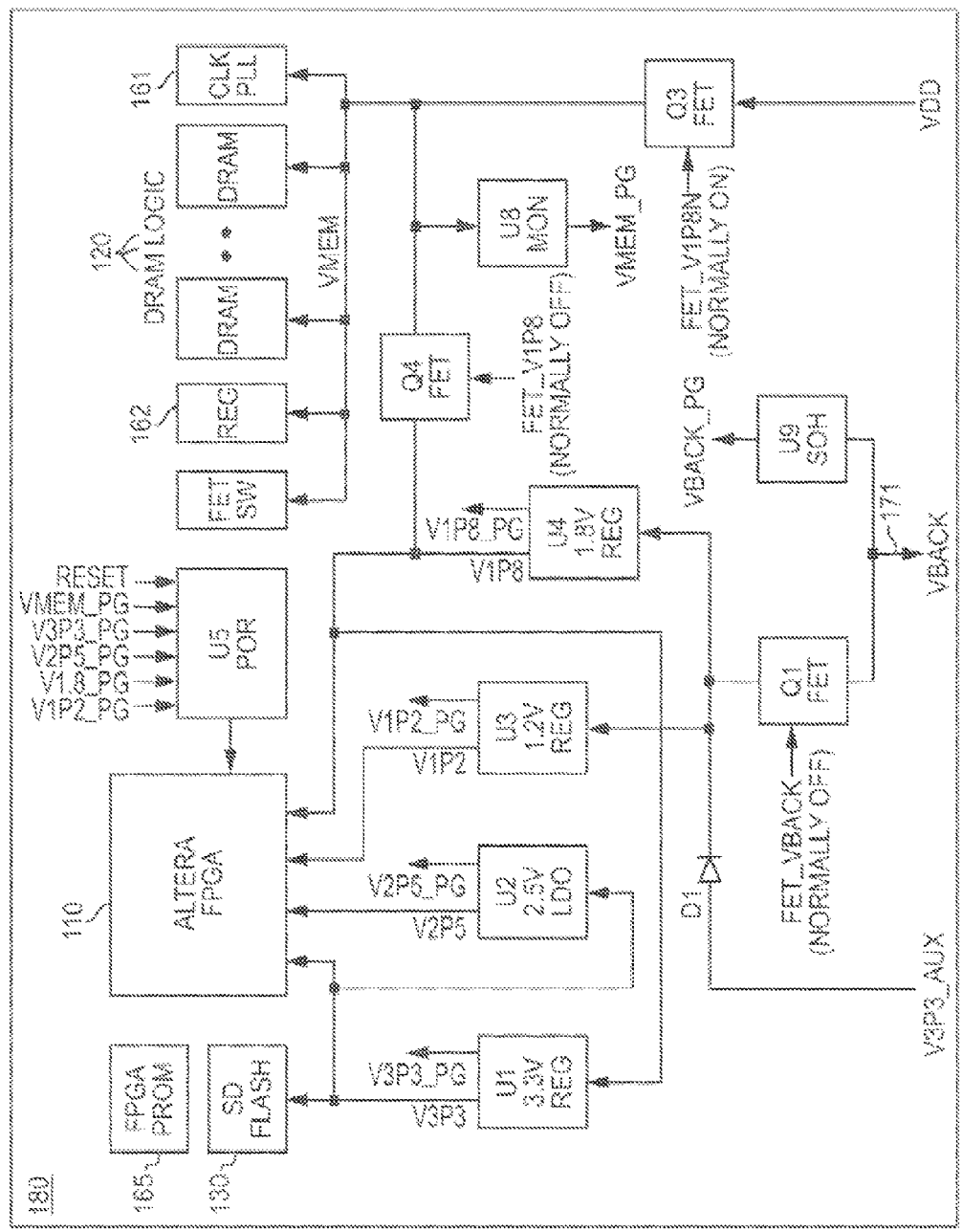
FIG. 8 shows the architecture of a power supply used to power the DIMM illustrated in FIG. 1.

The power supply of module 100 performs a number of system operations. It generates the voltage rails required for controller 110 and it isolates module 110 from the system rails during a power failure. FIG. 8 shows the structure of the power supply.

During normal operation, transistor Q3 and the diode D1 directs the system power VDD and V3P3_AUX to the devices on module 100. V3P3_AUX is an additional edge connector pin that supplies power for the non-standard devices on module 100. VDD is the standard module power source involving a number of edge connector pins. VMEM is the supply rail powering the module 100 devices. The V3P3_AUX voltage rail is converted to three additional supply rails required by controller 110. In general, the V1P2 and the V1P8 voltage rails supply the bulk of the controller power with the V2P5 rail supplying power for the FPGA analog PLLs and the V3P3 supplying power for the FPGA digital I/O, oscillator and the SD/MMC+ cards.

Controller 110 is informed of an imminent power loss either through edge connector signals or through the NVDIMM I2C interface. Once this occurs, controller 110 turns on Q1 and Q4 and turns off transistor Q3 to source power from the EDL capacitor bank connected to VBACK 171 and isolating the module from the system power. This power switch is hit-less as, in this case for example, the power supply regulators U1, U2, U3 and U4 are configured not to cause controller 110 to reset or the DRAM 120 to lose data. One method of switching between power supply sources is to use diode switching. The diode D1 prevents, for example, the EDL capacitor voltage from feeding back into the V3P3_AUX supply which may cause the supply to glitch if a transistor is used due to charge sharing between "decoupling" capacitors on the two rails (with one of the capacitors being the EDL capacitor bank). Depending on the type of power loss event, controller 110 may be requested to stop using the EDL capacitor bank and to move back to the system power. Again, this power switch is hit-less as to prevent data loss or glitches on the power rails.

Module 100 also charges and monitors the EDL capacitor bank using the VCHRG supply. This voltage rail is specified to be used for charging purposes only and the module continues to operate normally even when VCHRG is not connected. To improve the power efficiency of the EDL capacitor bank, the minimum input voltage of U3 and U4 can be as low as possible. This minimum input specification limits the low end of the EDL capacitor discharge curve as the backup operation must be complete before U3 or U4 reach their specification limit. For this reason, the V3P3 regulator U1 is a step-up regulator from the V1P8 supply allowing the minimum EDL discharge level to be as low as possible.

While cascading regulators affects the efficiency of the power supply, the V3P3 and V2P5 are relatively low power compared to the V1P8 supply. The power loss in cascading the V3P3 regulator U1 is significantly less than the improved EDL capacitor bank efficiency due to the lower minimum discharge level. A 1V decrease in the minimum EDL capacitor bank voltage is a 10% improvement in total system power while cascading V3P3 regulator U1 represents a rough 30% drop in efficiency of just the V3P3 supply rail (which is roughly 5 to 10% of the total system power).

The system of FIG. 1 supports four configurations of DRAM devices with different numbers of SD/MMC+ memory devices. Each configuration has different PCB layouts which allow the power supply design to adjusted to support the different loads. The power supply design can handle 70° C. ambient (PCB) temperature with no forced air flow. Components for the power supply design are located on one side of the PCB with a maximum height of 4 mm. The power supply takes no more than 3 inches by 1 inch of board space including any heat spreaders.

The VDD system rail is over-constrained so that the voltage drops across the transistor Q3 does not cause the VMEM supply to fall outside the downstream device ranges. The voltage drop budget the Q3 transistor voltage drop has been selected at arbitrary percentage of nominal value, but better performance is desirable.

The regulators shown in the diagram are functional and can be combined into multiple-output regulator devices. All voltage rails have monitors (the "PG" signals) which can be combined with the regulators or in a separate device. The V3P3 monitor is separate because it monitors the V3P3 rail while the V3P3_AUX rail is the power source. The V3P3 regulator does not function if VCHRG is not supplied, but this is not an error as module 100 must still continue to operate (see FIGS. 2 and 3). To increase the energy storage efficiency of the EDL capacitor bank, the minimum allowed input voltage to the regulators is as low as possible. The table below provides additional information for the regulators.

| Regulator | Min Input | Max Input | Notes |
|---|---|---|---|
| U1 V3P3 | 1.8 V | VBACK | 1, 2, 3 |
| U2 V2P5 | 2.8 V | VBACK | 3 |
| U3 V1P8 | 2.8 V | VBACK | 3 |
| U4 V1P2 | 2.8 V | VBACK | 3 |

Notes:
1. Closest headroom of all the regulators and limits the performance of the EDL capacitor bank.
2. Low-quiescent current requirement as the regulator idles (capacitance load) in normal operation.
3. Specifications based on configuration. See the section on voltage rails for specifications. Devices close to current specifications should be investigated as the power consumptions are still estimates.

The power transistors are responsible for moving the DRAM devices to the backup power and isolating the backup power from the system power VDD and V3P3_AUX. The capacitor charger U6 is handles the loss-of-power and prevents the EDL capacitor bank from discharging back through the charger. Transistors Q3 and Q4 is an n-channel MOSFETs and is controlled by the FPGA using 3.3V control signals removing the need for high-side drivers. Transistor Q1 is a p-channel MOSFET directly controlled by the FPGA or n-channel MOSFETs with some high-side drive mechanism (the VCHRG supply or VCAP supplies normally cannot be used unless the module continues to operate without these supplies). The currents listed in the table below have some over-design margin so transistors close to meeting the specification can also be used in this example design. During a power loss event, the transistors only operate until the EDL capacitor bank is discharged (e.g., a maximum of about 2 minutes).

| Transistor | Max VDS | Max IDD | On Resistance | Notes |
|---|---|---|---|---|
| Q1 | 12 V | 2700 mA | 0.020 ohm | 1 |
| Q3 | 1.8 V | 4000 mA | 0.009 ohm | 2 |
| Q4 | 1.8 | 650 mA | 0.056 ohm | 2 |

Notes:
1. Based on low supply specification of VCAP (2.8 V) and 2% margin in supply voltage.
2. Based on low supply current specification of supply and 2% margin of supply voltage.

EDL Capacitor Power Supply

Returning to FIGS. 2 and 3, EDL capacitor 210 or backup battery 310 connected to VBACK 171 are located external to module 100 because they are physically large and sensitive to temperature. The long term life of the EDL capacitors and batteries are sensitive to the ambient temperature as well as the operating voltage of the capacitor. For this design, the operating voltage has been chosen such that the capacitor will tolerant ambient temperatures less than 50° C. for at least 10 years. In general, the backup power is located near an air intake or another relatively cool location within the chassis. The backup controller 220 performs periodic state-of-health checks on the backup power source to determine if the power supply is no longer capable of sustaining and reporting the status through the NVDIMM I2C interface.

Long term lifetime of EDL capacitors show a correlation to temperature and operating voltage. Like aluminum capacitors, the lifetime generally doubles for every 10° C. decrease in temperature. Also like aluminum capacitors, the capacitor is exponentially sensitive to working voltage. Maxwell Technologies models the lifetime of the PC10 capacitors in hours using a thermal-non-thermal (T-NT) model:

$$L(V, T) = \frac{4.8901E - 06}{V^{7.9838} \exp\left(-\frac{9385.8}{T}\right)}$$

where T is the temperature in Kelvin and V is the working voltage in volts. This model assumes that at the end of capacitor's lifetime, the capacitance has decreased 20% from its initial value. A number of different operating environments are presented in the table below to show the expected lifetime of the PC10 capacitors:

| Description | Temp ° C. | Working Votlage | Lifetime Years |
|---|---|---|---|
| Room Temperature | 25 | 2.50 | 18 |
| Ambient (high voltage) | 40 | 2.50 | 3.9 |
| Ambient (reduce voltage) | 40 | 2.20 | 11 |
| Operating (high voltage) | 50 | 2.50 | 1.6 |
| Operating (reduce voltage) | 50 | 1.95 | 11 |
| Server (high voltage) | 60 | 2.50 | 0.7 |
| Server (reduced voltage) | 60 | 1.75 | 11 |
| Server (high voltage) | 70 | 2.50 | 0.3 |
| Server (reduced voltage) | 70 | 1.60 | 10 |

As shown, the capacitors are operated at low working voltages, which affects the structure of the voltage regulator. In a parallel configuration, the total capacitance is the sum of all the capacitors. However, the discharge current is large over a small voltage swing during use. The voltage regulator requires a boost switch-mode power supply architecture with high-current inductors. In a series configuration, the total capacitance is the reciprocal of the sum of the reciprocal of the capacitance, but the total working voltage has increased. Issues include balancing the operating voltage between capacitances and keeping the number of capacitors reasonable. For the purpose of the design exploration, the 50° C. operating temperature has been chosen allowing the design to use 75% of the capacitor working voltage for a 10 year life time. This scenario allows for a 15° C. rise in temperature over the common 35° C. external ambient temperature for enterprise computers within a server room. The other target environment would be a telecom NEBS standard with a 40° C. maximum ambient temperature that may increase to 50° C. ambient temperature with a 5° C. higher temperature within the equipment frame during short term HVAC failures. The length of the short-term temperature failures are defined to be up to 96 hours each, but not more than 15 days per year.

Figure 9:
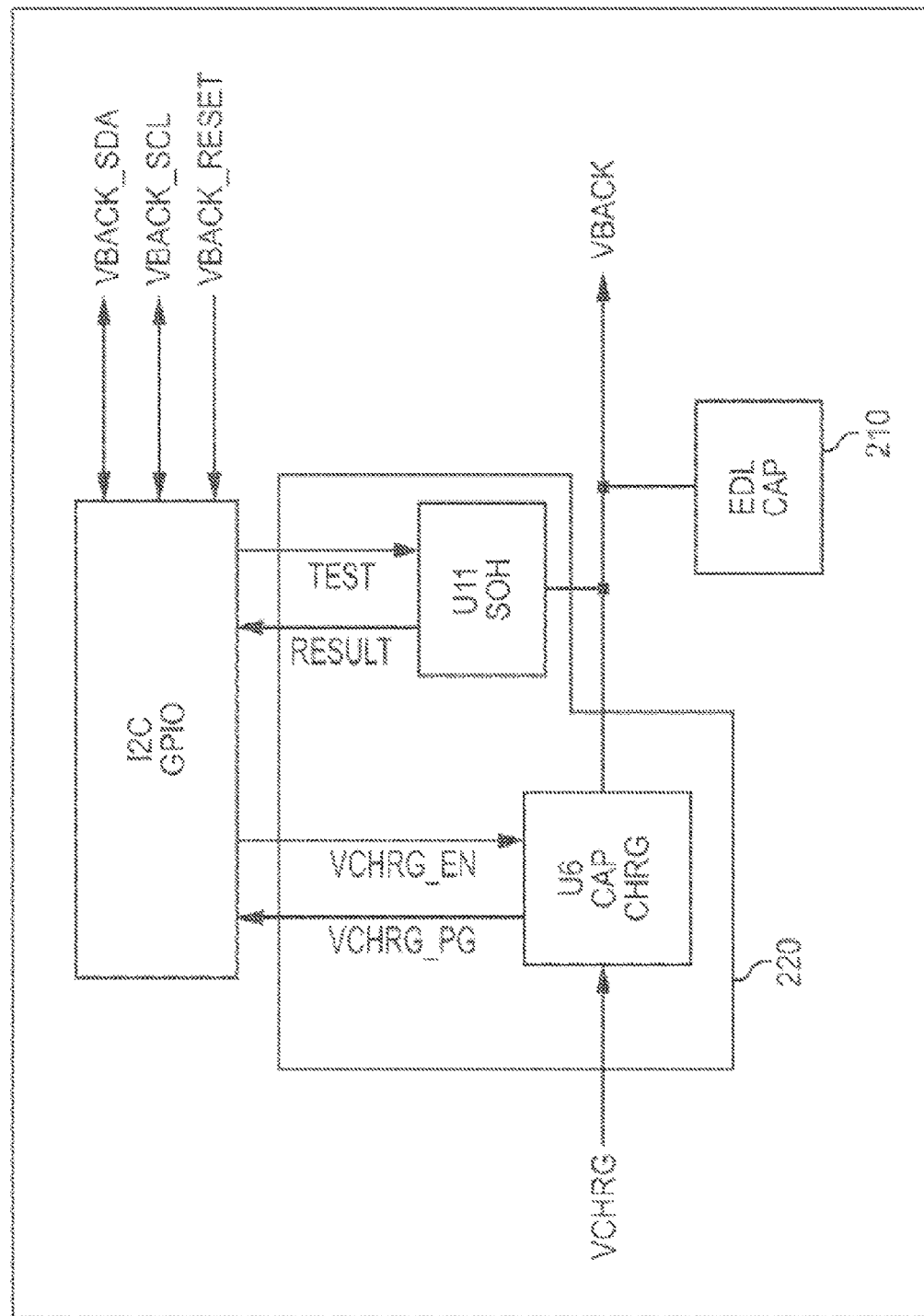
FIG. 9 is a more detailed illustration the backup power supply of FIG. 2.

FIG. 9 shows an external EDL capacitor backup power supply architecture, which is a more detailed version of FIG. 2. Some embodiments provide capacitor chargers, for example, a capacitor bank charger that implements a constant-current, constant-voltage design. The charger applies a constant current to the capacitor bank until the bank reaches its final full-charge voltage. At that point, the charger applies a constant-voltage to float the capacitor bank. The float voltage is applied because the EDL capacitors have a fairly large leakage current that require the balance resistors within the capacitor bank to be biased to ensure all the capacitors within the bank have equal charge voltage. The float voltage is programmable by a resistor and accurate to 1% as the capacitor bank size may be optimized for each configuration. The float voltage can be set from VCHRG (minus some headroom) to 6 volts. The design can leverage LiOn battery charger technology (commonly single-ended primary inductive converter or SEPIC architecture), but other techniques can be used. Some chargers require a small processor to monitor the charge cycle and switch the charger from constant-current operation to constant-voltage operation. For these designs, the processor within controller 110 can be used depending on the complexity of the algorithm and the hardware connectivity with the charger design. The tables below provide information related to VCHRG and VCAP.

| Supply Name | Nominal Voltage | Accuracy | Notes |
|---|---|---|---|
| VCHRG | 12 V | +/−5% | 1 |
| VCAP | 11.5 V | +/−1% | 2 |

Notes:
1. Can depend the system, for example, in some embodiments a wider supply range may have an advantage.
2. Nominal float voltage of the capacitor bank. During discharge cycle, regulators continue to operate until the capacitor bank discharges to 2.8 V or lower.

Notes:
1. Can depend the system, for example, in some embodiments a wider supply range may have an advantage.
2. Nominal float voltage of the capacitor bank. During discharge cycle, regulators continue to operate until the capacitor bank discharges to 2.8V or lower.

| Supply Name | Min Current | Max Current | Notes |
|---|---|---|---|
| VCHRG | | 500 mA | 1 |
| VCAP | 100 mA | 2700 mA | 2 |

Notes:
1. Based on an example customer specification that the charger consumes no more than max specification in all cases.
2. Based on U1 operating at 70% efficiency, U3 operating at 80% efficiency and U4 operating at 90% efficiency, that VCAP is operating at 2.8 V (low end of operating range) with a 2% loss.

The described embodiment also includes a state of health monitor for the backup power supply. EDL capacitors have a limited life time that is sensitive to the working voltage, ambient or storage temperature and the number of charge/discharge cycles (wearing). In some applications, only the working voltage and the ambient temperature are important, for example, if the number of predicted cycles is 100 times less than specification. The life-time of EDL capacitors is based on the capacitance degrading to a specified threshold (in most cases 30% drop from initial capacitance) or the ESR of the capacitance increasing to a specified threshold (depending on the manufacturer a 30% to 100% increase from initial ESR). Given the sensitivity of the EDL capacitor to stress, the controller monitors the state-of-health of the capacitor. The state-of-health monitor U11 (of FIG. 9) can be combined with the charger U6 depending on the implementation. A state of health monitor informs the FPGA if the capacitor bank is charged sufficiently to handle a loss-of-power. In general, the charger U6 must be able to "turn off" during the test. In, for example, embodiments with a number of capacitors in series, the voltage across each capacitor can be monitored and fed into signals that can be checked over the backup power supply I2C bus. This allows for the identification of a specific capacitor that has failed as well as indication that the backup power source has failed overall.

Measuring the time from power-on (VCHRG power is applied) to when VCAP reaches the fully-charged state provides a method of estimating the health of the capacitor bank. Controller 110 can report whether module 100 is capable of handling a power loss event. If the capacitor bank never achieves a full-charge state, the system detects this and declares an error.

To measure capacitance, the capacitor is fully charged. The charger is first turned off and a fixed known load (resistor) is applied to the capacitor bank for a period of time to slightly discharge the capacitor. In general, the load current is small to prevent ESR from affecting the measurement. The measurement method can be as simple as a voltage comparator that triggers an interrupt on controller 110 if the VCAP supply drops below a fixed voltage. If the interrupt is triggered during the test, the capacitance is too low and the capacitor bank has failed the test. One issue is that the capacitor is discharged partially which must be accounted for in the energy budget as a power loss event could occur right after the self-test.

In order to minimize the cost of the EDL capacitor power supply, the self-test intelligence is located on module 110. To control the logic in the power supply, an I2C to GPIO expander device is used. Thus, controller 110 is able to control and monitor signals on the backup power supply module (e.g., 200 or 300).

As discussed, in some cases, a battery may be selected over an EDL capacitor because batteries have a higher energy density than EDL capacitors and thus require less volume and mass. For instance, a single A123 battery is rated for 2.3 Ah at 3.3V, weighs 70 grams and requires 2 cubic inches. If module 100 requires 5 Watts for 2 minutes, the required energy is only 0.05 Ah which is over an order of magnitude less than the battery capacity. Most battery chargers for portable laptop computers have all the necessary functions required for the backup power supply. In addition, most of these devices have an integrated I2C interface for monitoring, configuration and control that can be used by module 100.

SD Data Format

In single SD/MMC+ card operation, the first block of the SD card (bytes 0 to 511) is used for SPD and flash configuration purposes. The remaining blocks in the SD card are used for backup data. During backup operation, the backup data is read from the first DRAM device in a continuous byte stream and written into the single flash memory. The backup controller then repeats the process for the other DRAM devices until backups of all of the other devices are completed. During restore operation, the data is read from the single flash memory in a continuous byte stream and written into the first DRAM device. The backup controller then repeats the process for the other DRAM devices until all the other devices are completed. The backup controller streams read and write data to the flash memory using one single sequential read/write operation. This mechanism allows the SD card to perform at maximum bandwidth, but has the side effect that the alignment of each DRAM backup image may cross SD card block boundaries if the length of each DRAM backup image is not a multiple of 512 bytes.

For dual SD/MMC+ card operation, the first block of the SD card (bytes 0 to 511) in slot 0 is used for SPD and flash configuration purposes. The first block of the other SD card in slot 1 is not used and is ignored. During backup operation, data is read from the first DRAM device in a continuous byte stream and written to both flash memories at the same time. The data stream is split into two flash write data streams by sending all even order bytes to slot 0 and all odd order byte to slot 1. The backup controller then repeats the process for the other devices until all the DRAM devices are completed. During restore operation, data is read from both flash memories which is combined by byte interleaving the data streams to form a single data stream that is written to the first DRAM. The backup controller then repeats the process for the other DRAM devices until all the devices are completed. The backup controller streams read and write data to the flash memory using one single sequential read/write operation for each SD card. This mechanism allows the SD cards to perform at maximum bandwidth, but has the side effect that the alignment of each DRAM backup image may cross SD card block boundaries if the length of each DRAM backup image is not a multiple of 1 kbytes.

For quad SD/MMC+ card operation, the first block of the SD card (bytes 0 to 511) in slot 0 is used for SPD and flash configuration purposes. The first block of the other SD card in slot 1 is not used and is ignored. During backup operation, data is read from the first DRAM device in a continuous byte stream and written to all flash memories at the same time. The data stream is split into four flash write data streams by sending every 4 bytes to an interface. The backup controller then repeats the process for the other devices until all the DRAM devices are completed. During restore operation, data is read from both flash memories which is combined by byte interleaving the data streams to form a single data stream that is written to the first DRAM. The backup controller then repeats the process for the other DRAM devices until all the devices are completed. The backup controller streams read and write data to the flash memory using one single sequential read/write operation for each SD card. This mechanism allows the SD cards to perform at maximum bandwidth, but has the side effect that the alignment of each DRAM backup image may cross SD card block boundaries if the length of each DRAM backup image is not a multiple of 2 kbytes.

The table below provides example backup times calculated using a worst case write/read bandwidth of 20 Mbyte/sec for each SD/MMC card and 40 Mbyte/sec for each MMC+ card. The calculation also includes the worst case SD/MMC+ write interval for updating the flash configuration.

| NVDIMM Size | Total Data | One SD/MMC Interface Active (20 Mbyte/sec) | Two SD/MMC Interface Active (40 Mbyte/sec) | Four MMC+ Interface Active (160 Mbyte/sec) |
| --- | --- | --- | --- | --- |
| 256 Mbyte | 288 Mbyte | 15 sec | 8 sec | 2 sec |
| 512 Mbyte | 576 Mbyte | 30 sec | 15 sec | 4 sec |
| 1 Gbyte | 1152 Mbyte | 58 sec | 30 sec | 8 sec |
| 2 Gbyte | 2304 Mbyte | 116 sec | 59 sec | 16 sec |

Burn-in Self-Test Operation

DIMM 100 also includes self-test functionality. Self-test can be triggered using the PRODTEST input on the FPGA as well as through the NV I2C interface. The results of the self-test are stored permanently until the flash memory is erased through another self-test sequence. In one example, self-test: takes over the DDR interface (FET switches are off); sets the SELFTEST test in progress bit high; fills DRAM memory with 0xA5; fills flash memory with 0x00; turn on progress LED; backups DRAM memory to flash memory; fill DRAM memory with 0x00; restore DRAM memory from flash memory; tests contents of DRAM memory; and, if an error is detected sets an error LED and stores the results in flash. If no error is found, the process loops back to fill the flash memory with 0x00. Self-test methods can be defined by various users of the system of FIG. 1, for example, they can be defined by a customer.

Visual Indicators

Visual indications on the board allow for diagnosing system problems with memory module particularly when multiple modules 100 are used within a system. In the following cases, a slow flash of an LED is 0.25 seconds on and 1 second off while a fast flash of an LED is 0.5 seconds on and 0.5 seconds off. The memory module has an LED to indicate the backup operation is occurring. Given that some configurations take multiple minutes to complete the backup operation, an LED indicates to a repair technician that the module 100 or capacitor bank must not be disturbed after a power-loss event.

| Red LED | Description |
| --- | --- |
| Off | System power and capacitor power is off or memory module is operating in normal operation (POWER UP or IDLE state). If system power is off, the memory module and/or the capacitor bank may be disconnected. |
| Slow Flash | RESTORE operation (flash to DRAM) operation in progress. |
| Fast Flash | BACKUP operation (DRAM to flash) operation in progress. |
| On | Restore operation completed, waiting for DRAM to be flushed before transiting to IDLE |

A visual indication is supplied for the backup power supply to indicate that the backup power is correctly connected, charging, fully charged or failed. This can be useful, for example, in a system with multiple modules 100, it is possible that repair technician must physically identify a failed module or capacitor for replacement.

| Green LED | Description |
| --- | --- |
| Off | No backup power supply is connected or module is open. |
| Slow Flash | Backup power supply is charging. |
| Fast Flash | Backup power supply has failed self-test. |
| On | Backup power supply is fully charged. |

Visual indication LEDs are also used during burn-in testing. The red LED latches on if any of the self-tests failed during the burn-in testing. The green LED will flash during self-test as proof that the self-test operation is progressing. The green LED toggles at the end of each test period (write/read DRAM and write read flash memory) while the test progresses.

For example, the external system can include various types of systems, for example, a mainframe, a server, a client, a network of various systems, etc. Volatile memory 120 can include, for example, Dynamic random access memory (DRAM), Z-RAM®, Static random access memory (SRAM), Twin Transistor RAM (TTRAM), etc. Non-volatile memory 130 can include, for example, Read-only memory (ROM), flash memory, Ferroelectric RAM (Fe-RAM), programmable metallization cell (PMC), etc. In some embodiments, backup power supply 200 can be included as part of DIMM 100, while in other embodiments it can be, for example, an external device. Non-volatile memory 130 and volatile memory 120 can be of various sizes and need not be the same size. During a backup operation various embodiments can move all data stored in volatile memory 120 to non-volatile memory 120 or some subset of the data stored in volatile memory 120. The same is true during a restore operation from non-volatile memory 120 to non-volatile memory 130. Some embodiments of FIG. 1 do not include each component and/or function of FIG. 1. For example, some embodiments do not include isolation logic 140, some embodiments do store SPD information in volatile memory 130, some embodiments move all data stored in volatile memory 130 to non-volatile memory 120 at the same time (e.g., every DRAM device at once), and some embodiments move the data stored volatile memory 130 to non-volatile memory 120 in chunks, for example, one DRAM device at a time.

Controller 110 can be implemented, for example, using various FPGAs, controllers, processors, and/or memories. In another embodiment, non-volatile controller 110 is an application-specific integrated circuit (ASIC) that includes a flash chip interface inside the controller. By incorporating the flash chip interfaces into the ASIC controller, external SD/MMC+ controllers are not used, and save/restore performance can be improved. In another embodiment, volatile memory 120 can be separated into various segments using various starting and ending addresses. These addresses can be configured by setting registers in controller 110 through the NVDIMM I2C bus. Which (and in what order) the segments defined by these addresses should be backed-up and/or restored is also controllable by setting registers in controller 110. Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow.

The invention claimed is:
1. A memory system comprising:
a plurality of volatile memory devices;
a non-volatile memory system including a non-volatile memory device, the non-volatile memory system configured to store in the non-volatile memory device at least one parameter describing one of the plurality of volatile memory devices;
an interface configured to couple a backup power source to the one of the plurality of volatile memory devices to temporarily provide power upon a loss of power from a primary power source; and
a controller in communication with the one of the plurality of volatile memory devices and the non-volatile memory device, the controller configured to cause the one of the plurality of volatile memory devices to be taken out of a low power mode and to transmit data to the non-volatile memory device upon the loss of power from the primary power source for the one of the plurality of volatile memory devices, and to cause the volatile memory devices that are not transmitting data to enter into the low power mode,
wherein the controller is configured to not transmit data from the one of the plurality of volatile memory devices, during the loss of power, upon receipt of a signal to ignore data in the one of the plurality of volatile memory devices.

2. The memory system of claim 1, wherein the at least one parameter comprises one of serial presence detect information, a size of the one of the plurality of volatile memory devices, or a speed of the one of the plurality of volatile memory devices.

3. The memory system of claim 1, wherein the controller further comprises a cache memory device for storing the at least one parameter.

4. The memory system of claim 1, further comprising a configuration data bus for accessing the at least one parameter.

5. The memory system of claim 1, further comprising a configuration data bus for accessing the at least one parameter, and wherein the controller is further configured retrieve the at least one parameter in response to receiving a request for the at least one parameter over the configuration data bus.

6. The memory system of claim 1, wherein the controller is further configured to cause the non-volatile memory device to transmit data to the one of the plurality of volatile memory devices upon a restoration of power of the primary power source.

7. The memory system of claim 1, wherein the backup power source comprises a capacitor.

8. The memory system of claim 7, wherein the controller is configured to determine a health of the capacitor by measuring an amount of time it takes to fully charge the capacitor.

9. The memory system of claim 1, wherein the data transmitted by the one of the plurality of volatile memory devices comprises directory information that indicates a location of data in a file system of the one of the plurality of volatile memory devices.

10. The memory system of claim 1, wherein when the power of the primary power source returns before the one of the volatile memory devices completes the transmission of the data to the non-volatile memory device, the controller is further configured to enable retrieval of the data directly from the one of the plurality of volatile memory devices.

11. The memory system of claim 1, wherein, upon a loss of power of the primary power source for the plurality of volatile memory devices, the controller is configured to cause each of the plurality of volatile memory devices to transmit data to the non-volatile memory device in a sequential manner.

12. A method comprising:
    maintaining at least one parameter describing one of a plurality of volatile memory devices at a non-volatile memory system including a non-volatile memory device;
    upon a loss of power of a primary power source at the one of the volatile memory devices:
        causing the volatile memory devices not transmitting data to enter into a low power mode; and
        causing the one of the volatile memory devices to be taken out of the low power mode and to transmit data to the non-volatile memory system based on the at least one parameter while the one of the volatile memory devices is temporarily powered by a backup power source, thereby causing the non-volatile memory device to store both the data transmitted by the one of the volatile memory devices and the at least one parameter,
    wherein the one of the volatile memory devices will not transmit data during the loss of power, when a signal to ignore data, in the one of the plurality of volatile memory devices, is asserted.

13. The method of claim 12, wherein the at least one parameter comprises at least one of serial presence detect information, a size of the one of the volatile memory devices, or a speed of the one of the volatile memory devices.

14. The method of claim 12, further comprising causing the non-volatile memory device to transmit data to the one of the volatile memory devices upon a restoration of power of the primary power source.

15. The method of claim 12, wherein the backup power source comprises a capacitor.

16. The method of claim 15, further comprising determining a health of the capacitor by measuring an amount of time it takes to fully charge the capacitor.

17. The method of claim 12 further comprising storing the data in a plurality of storage devices in the non-volatile memory device.

18. The method of claim 12, further comprising, upon a loss of power of the primary power source for the plurality of volatile memory devices, causing each of the plurality of volatile memory devices to transmit data to the non-volatile memory device in a sequential manner.

19. The method of claim 12, further comprising, when the power of the primary power source returns before the one of the plurality of volatile memory devices completes the transmission of the data to the non-volatile memory device, enabling retrieval of the data directly from the one of the plurality of volatile memory devices.

20. The method of claim 12, further comprising receiving a notification of an imminent power loss through one of an edge connector or an I²C interface.

\* \* \* \* \*